US011175325B2

(12) United States Patent
Grimm

(10) Patent No.: US 11,175,325 B2
(45) Date of Patent: Nov. 16, 2021

(54) POWER ANALYZER SYSTEM AS WELL AS POWER ANALYZER SETUP

(71) Applicant: Rohde & Schwarz GmbH & Co. KG, Munich (DE)

(72) Inventor: Michael Grimm, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 73 days.

(21) Appl. No.: 16/734,743

(22) Filed: Jan. 6, 2020

(65) Prior Publication Data
US 2020/0256909 A1 Aug. 13, 2020

(30) Foreign Application Priority Data
Feb. 7, 2019 (EP) .................................. 19155975

(51) Int. Cl.
*G01R 29/08* (2006.01)
*G01R 21/06* (2006.01)

(52) U.S. Cl.
CPC ......... *G01R 29/0892* (2013.01); *G01R 21/06* (2013.01)

(58) Field of Classification Search
CPC .... G01R 29/0892; G01R 21/06; G01R 13/02; G01R 31/001; G01R 21/133; G01R 29/0814
USPC ....................................................... 324/307
See application file for complete search history.

(56) References Cited

U.S. PATENT DOCUMENTS

| 6,215,295 | B1 | 4/2001 | Smith, III |
| 6,553,502 | B1 | 4/2003 | Hurd et al. |
| 9,568,368 | B2 * | 2/2017 | Bohn ..................... G01R 19/00 |
| 9,870,690 | B2 * | 1/2018 | Laflen ..................... H04W 4/80 |
| 2006/0181560 | A1 | 8/2006 | Pehrsson et al. |
| 2013/0006570 | A1 * | 1/2013 | Kaplan .............. G01R 1/06788 |
| | | | 702/125 |

OTHER PUBLICATIONS

Lindh, Joakim, Christin Lee, and Marie Hernes. "Measuring bluetooth low energy power consumption." Application Note AN092 (2017). (Year: 2017).*

* cited by examiner

*Primary Examiner* — Christopher P McAndrew
(74) *Attorney, Agent, or Firm* — Christensen O'Connor Johnson Kindness PLLC

(57) ABSTRACT

A power analyzer system for correlating power consumption and RF signals of a device under test has a RF sensor unit, a power probe unit and an analysis device being a physically separate device from the RF sensor unit and the power probe unit. The analysis device has a standardized interface module by which the analysis device is connected to the RF sensor unit and the power probe unit. The analysis device is configured to control the RF sensor unit and the power probe unit and to synchronously display a representation of the RF signal of the device under test and a representation of the power consumption of the device under test. Further, a power analyzer setup is shown. The units or devices can comprise one or more circuits to carry out its respective or other functionality.

17 Claims, 1 Drawing Sheet

POWER ANALYZER SYSTEM AS WELL AS POWER ANALYZER SETUP

FIELD OF THE DISCLOSURE

Embodiments of the disclosure relate to a power analyzer system for correlating power consumption and radio frequency signals of a device under test as well as a power analyzer setup.

BACKGROUND

The battery lifetime of radio frequency devices, especially devices for the Internet of Things (IoT), has become a very important design factor for manufacturers of such devices. To further improve the battery lifetime, the devices have to be debugged in a way that the power consumption has to be correlated with the emission of radio frequency signals.

Oscilloscopes having the mentioned correlation ability are known but oscilloscopes are very expensive and difficult to use.

SUMMARY

Thus, there is a need for a power analyzer system and a power analyzer setup that provide a correlation of the power consumption and radio frequency signals of a device under test cost-efficiently and easily.

For the above purpose, a power analyzer system for correlating power consumption and RF (radio frequency) signals of a device under test is provided. In an embodiment, the system includes a RF sensor unit for sensing a RF signal of the device under test, a power probe unit for sensing a power consumption of the device under test and an analysis device being a physically separate device from the RF sensor unit and the power probe unit. The analysis device comprises a display module and a standardized interface module for a standardized data protocol by which the analysis device is connected to the RF sensor unit and the power probe unit. The analysis device is configured to control the RF sensor unit and the power probe unit, to receive measurement values from the RF sensor unit and the power probe unit as well as to synchronously display a representation of the RF signal of the device under test and a representation of the power consumption of the device under test.

By using a dedicated radio frequency unit and power probe unit, the costs for the system are reduced, as these units are well established in the market.

Further, by providing a standardized interface module, the analysis may be done without the need for specialized hardware, like an oscilloscope.

The analysis device is for example a personal computer, like a laptop computer, a desktop computer, a tablet or a smartphone. In some embodiments, the analysis module is not an oscilloscope.

In some embodiments, the power probe unit and/or the RF signal sensor unit may have an Analog-to-Digital converter.

In some embodiments, the RF signal sensor unit does not sample the RF signal received from the device under test. Further, no analysis of bus protocols or symbols contained in the signals of the device under test is performed.

In an aspect of the disclosure, the representation of the RF signal and the representation of the power consumption are displayed over time, for example on the same timescale, for example in the same diagram. This way, correlations are determined more precisely.

In order to allow a broad range of device to be used as the analysis device, the standardized data protocol is a wireless local area network (WLAN) protocol, a Bluetooth protocol, a universal serial bus (USB) protocol and/or an Ethernet protocol and the interface module is a wireless local area network interface module, a Bluetooth interface module, a universal serial bus interface module and/or an Ethernet interface module, respectively.

The wireless local area network protocol is, for example, standardized in the standard IEEE 802.11, the Ethernet protocol is, for example, standardized in the standard IEEE 802.3, the Bluetooth protocol is, for example, standardized in the Bluetooth special interest group and the USB protocol is, for example, standardized in the standards of the USB Implementers Forum.

In some embodiments, the power consumption of the device under test may be analyzed in more detail as the power probe unit may be configured to measure the voltage supplied to the device under test, the current supplied to the device under test and/or the power supplied to the device under test.

The power probe may be a so-called V/I/P analyzer unit.

For precise correlations, the representation of the power consumption may represent the voltage supplied to the device under test, the current supplied to the device under test and/or the power supplied to the device under test.

In an embodiment of the disclosure, the representation of the RF signal represents the power of the RF signal of the device under test, for example the total power or the power in a predetermined frequency band allowing a precise analysis of the RF activities of the device under test.

In an aspect of the disclosure, the RF sensor unit is a RF power sensor unit for a precise and cost efficient measurement. The RF power sensor unit may measure the total power of the RF signal or the power of the RF signal in a predetermined frequency band.

For example, the RF sensor unit comprises a diode rectifier, a thermal power measurement module, a spectrum analyzer and/or a RF receiver providing exact measurements at low cost.

In a further embodiment, the power analyzer system comprises a synchronization link between the RF sensor unit and the power probe unit for synchronization of the measurements. This way, the correlations are determined with higher precision.

The synchronization link, for example a cable, may be configured to synchronize the measurement of the RF sensor unit and the measurement of the power probe unit.

In order to provide a compact system, the power analyzer system comprises a housing in which the RF sensor unit, the power probe unit and/or the synchronization link are integrated and/or arranged. In some embodiments, the analysis device is separate from the housing.

To facilitate debugging, the analysis device may be configured to execute a debugging software for debugging the device under test, wherein the analysis device is further configured to synchronize the debugging software with the displaying of the representation of the RF signal of the device under test and the representation of the power consumption of the device under test.

In an aspect of the disclosure, the analysis device is configured to trigger the measurement of the RF sensor unit and the power probe unit based on the signal of the RF sensor unit and/or the power probe unit to focus the measurements on certain events.

For the above purpose, a power analyzer setup is provided in some embodiments, comprising a power analyzer system according to the disclosure and a device under test. The power probe unit is connected to the device under test such that the power probe unit is able to measure the power consumed by the device under test, and the RF sensor unit is arranged such that the RF sensor unit receives a RF signal generated by the device under test.

The features and advantages of the power analyzer system also apply to the power analyzer setup and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

Figure 1:
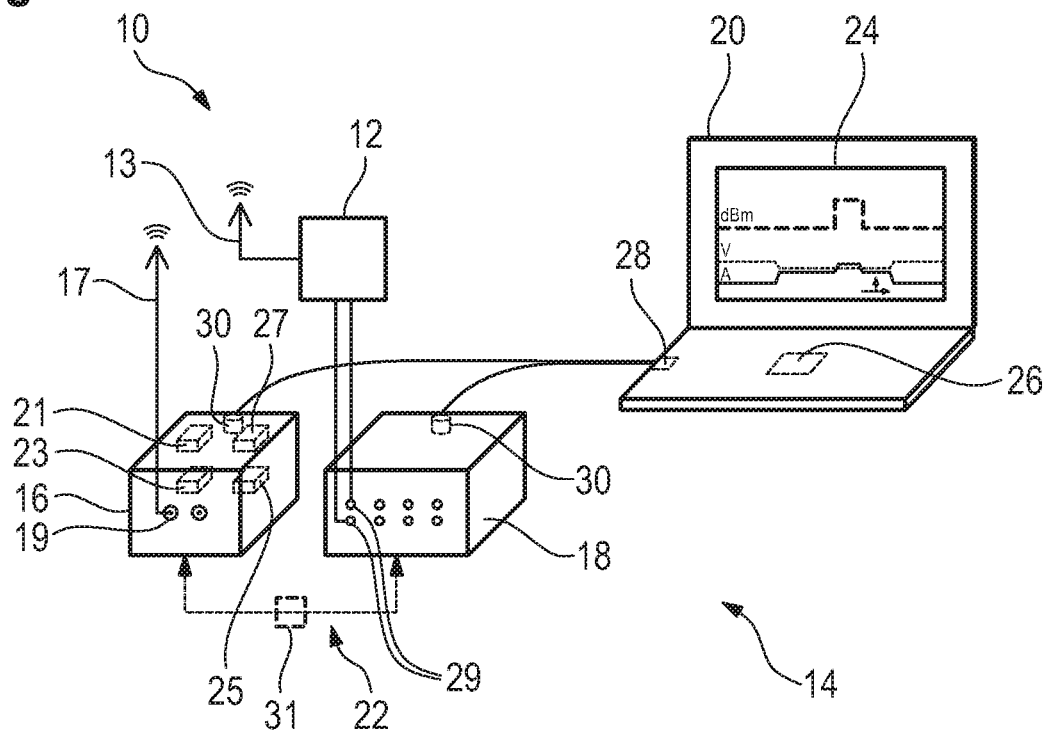
FIG. 1 shows schematically a first embodiment of a power analyzer setup according to the disclosure with a first embodiment of a power analyzer system according to the disclosure.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. In FIG. 1, a power analyzer setup 10 with a device under test 12 and a power analyzer system 14 is shown. The device under test 12 may be a radio frequency device for a specific purpose running on batteries. For example, the device under test 12 is a radio frequency module for an IoT (Internet of Things) component and may comprise an antenna 13 for radio frequency transmission.

The power analyzer system comprises a RF (radio frequency) sensor unit 16, a power probe unit 18, an analysis device 20 and a synchronization link 22. The RF sensor unit 16 is a RF power sensor unit, meaning that the RF sensor unit 16 is configured to measure the power of a radio frequency signal received. The RF sensor unit 16 may be configured to measure the total power of the radio frequency signal received or the power of the signal received within a predetermined frequency band.

In an embodiment, the RF sensor unit 16 may comprise a diode rectifier 21, a thermal power measurement module 23, a spectrum analyzer 25 and/or a RF receiver 27. The spectrum analyzer 25 in some embodiments may include one or more circuits.

Of course, the RF sensor unit 16 comprises an antenna 17 connected to a measurement input 19 of the RF sensor unit 16. The RF sensor unit 16, more precisely its antenna 17, is arranged with respect to the device under test 12 such that the RF sensor unit 16 receives radio frequency signals generated by the device under test 12.

The power probe unit 18 may be a V/I/P analyzer circuit or unit being able to measure a voltage, a current or a power. The power being the current times the voltage for direct current (DC). The power probe unit 18 is connected to the device under test 12 at the power supply e.g. the battery of the device under test 12 via at least one measurement input 29 of the power probe unit 18. In some embodiments, measurement inputs 29 of the power probe unit 18 are connected to the two poles of a battery of the device under test 12 or a DC power source of the device under test 12. Thus, the power probe unit 18 is connected to the device under test 12 such that it is able to measure the power consumed by the device under test 12.

The synchronization link 22 may be a cable connecting the power probe unit 18 and the RF sensor unit 16 such that they share a common clock for their measurement intervals. The synchronization link 22 may also comprise a separate clock signal generator 31 (shown in dashed lines in FIG. 1).

In some embodiments, the analysis device 20 may be a personal computer, like a laptop computer, a desktop computer, a tablet and/or a smartphone. Especially, the analysis device 20 is not an oscilloscope. The analysis device 20 is thus a device separate from the RF sensor unit 16 and the power probe unit 18.

In some embodiments, the analysis device 20 comprises a display circuit or module 24, a control circuit or unit 26 for the analysis device 20 and at least one standardized interface circuit or module 28. The standardized interface module 28 may be a wireless local area network (WLAN) interface module (Wi-Fi module), a Bluetooth interface module, a universal serial bus (USB) interface module and/or an Ethernet interface module.

Using the standardized interface module 28, the analysis device 20 is connected to the RF sensor unit 16 and the power probe unit 18.

The RF sensor unit 16 and the power probe unit 18 also comprise corresponding standardized interface circuits or modules 30. Thus, the analysis device 20, the RF sensor unit 16 and the power probe unit 18 are connected for the exchange of data using a standardized data protocol like the wireless local area network protocol, the Bluetooth protocol, the universal serial bus protocol and/or the Ethernet protocol.

For measuring or correlating the power consumption of the device under test 12 with the emission of radio frequency signals by the device under test 12, the radio frequency sensor unit 16 measures the power of the radio frequency signals of the device under test 12, digitizes the measurement values and transmits the digitized measurement values to the analysis device 20 via the standardized interface modules 30, 28.

Likewise, the power probe unit 18 measures the voltage, the current and/or the power supplied to the device under test 12, digitizes the measurement values and transmits the digitized measurement values to the analysis device 20 using the standard interface modules 30, 28.

Thus, the RF sensor unit 16 and the power probe unit 18 both digitize the outcomes of the measurement with at least an analog-to-digital converter (not shown).

However, in some embodiments the radio frequency signals received by the RF sensor unit 16 are not sampled or analyzed concerning a bus signal or symbols that are transferred by the signal. This is neither done in the RF sensor unit 16 nor in the analysis device 20, for example.

The measurements are synchronized by the synchronization link 22 so that the measurement values of that RF sensor unit 16 and of the power probe unit 18 correspond to measurements taken at exactly the same time.

The RF sensor unit 16 and the power probe unit 18 as well as the synchronization link 22 may be controlled by the analysis device 20. For example, the analysis device 20 may be configured to trigger the measurement of the RF sensor unit 16 and the power probe unit 18 based on the signals of the RF sensor unit 16 and/or the power probe unit 18. For example, a measurement may be triggered if it is detected that the device under test 12 emits a radio frequency signal.

The analysis device 20 receives the measurement values from the RF sensor unit 16 and the power probe unit 18 and displays on its display module 24 a diagram showing a representation the radio frequency, especially the power of the radio frequency signal of the device under test 12 and a representation of the power consumption of the device under test, for example as a representation of the voltage supplied to the device under test 12, the current supplied to the device under test 12 and/or the power supplied to the device under test 12.

Such a diagram can be seen in FIG. 1, in which the total power of the RF signal received by the RF sensor unit 16 (upper line) as well as the voltage V and the current A supplied to the device under test 12—measured by the power probe unit 18—are drawn over time on the same time scale in the same diagram.

Of course, it is also possible that only the power of the radio frequency signal of the device under test 12 in a predetermined frequency band is displayed.

In this case, the RF sensor unit 16 may comprise suitable filtering means, such as a filter circuit. Of course, the filter can be also carried out in software in some embodiments.

The representations of the RF signal and the power consumption of the device under test 12 are shown synchronously so that the power consumption and the RF signals generated are correlated, thus a user of the power analyzer system 14 may easily detect correlations between the power consumption and the radio frequencies emitted from the device under test 12.

Further, expensive equipment, like an oscilloscope, is not necessary as the RF sensor unit 16 and the power probe unit 18 may be acquired as separate devices. For example, the RF sensor unit 16 may be a Rhode & Schwarz sensor of the NRP series and the power probe unit 18 may be a Rhode & Schwarz multi-channel power probe unit.

The power analyzer system 14 and the RF sensor unit 16 may be powered via the standardized interface modules 28, 30, especially in case of USB or Ethernet as the interface.

Figure 2:
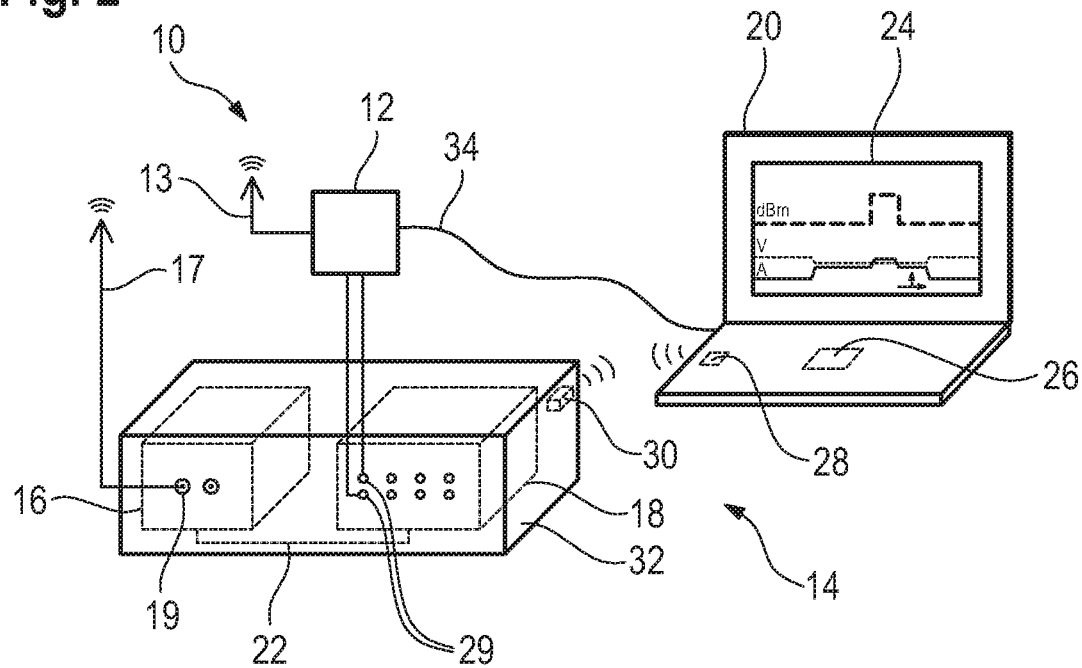
FIG. 2 shows schematically a second embodiment of a power analyzer setup according to the disclosure with a second embodiment of a power analyzer system according to the disclosure.

FIG. 2 shows a second embodiment of the power analyzer setup 10 with a second embodiment of the power analyzer system 14. The power analyzer system 14 of the second embodiment corresponds to the power analyzer system 14 of the first embodiment so that only the differences are explained in the following. The same and functionally the same parts are referred to with the same reference signs.

In the second embodiment, the power analyzer system 14 comprises a housing 32 for the radio frequency sensor unit 16, the power probe unit 18 and the synchronization link 22. The housing 32 may be a rack or, as shown in FIG. 2, a housing in which the RF sensor unit 16, the power probe unit 18 and the synchronization link 22 are integrated. Similarly to the first embodiment, the analysis device 20 is separate from the housing 32.

In the embodiment of FIG. 2, the standardized interface is a wireless interface whereas in FIG. 1, a cable has been shown. For example, the standardized interface modules 28, 30 in the second embodiment are wireless local area network interface modules or Bluetooth interface modules.

Another difference to the first embodiment lies in the fact that, in the second embodiment, the analysis device 20 is connected to the device under test 12, for example for debugging.

The connection is shown with a cable 34, but it is of course possible that the connection is established wirelessly.

Any of the mentioned interface modules and protocols may be used for the connection between the device under test 12 and the analysis device 20.

In the second embodiment, the analysis device 20, especially the control circuit or unit 26, is configured to execute a debugging software for debugging the device under test 12 and simultaneously perform the measurement described above.

Further, the analysis device 20 controls the debugging software and the measurements such that the debugging, e.g. transmission of a debugging signal to the device under test 12, is synchronized with the measurements and the displaying of the representations of the radio frequency signal of the device under test 12 and of the power consumption of the device under test 12.

The shown embodiments are of course only examples of possible embodiments and the features of the different embodiments may be combined arbitrarily.

Especially, a connection between the analysis device 20 and the device under test 12 and/or a housing 32 may also be provided in the first embodiment.

Certain embodiments disclosed herein utilize circuitry (e.g., one or more circuits) in order to implement protocols, methodologies or technologies disclosed herein, operably couple two or more components, generate information, process information, encode signals, decode signals, transmit and/or receive signals, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near,"

etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A power analyzer system for correlating power consumption and RF signals of a device under test, having a RF sensor unit for sensing a RF signal of the device under test, a power probe unit for sensing a power consumption of the device under test and an analysis device being a physically separate device from the RF sensor unit and the power probe unit,
   wherein the analysis device comprises a display module and a standardized interface module for a standardized data protocol by which the analysis device is connected to the RF sensor unit and the power probe unit,
   wherein the analysis device is configured to control the RF sensor unit and the power probe unit, to receive measurement values from the RF sensor unit and the power probe unit as well as to synchronously display a representation of the RF signal of the device under test and a representation of the power consumption of the device under test, and
   wherein the power analyzer system comprises a synchronization link between the RF sensor unit and the power probe unit for synchronization of the measurements, wherein the measurements are synchronized by the synchronization link.

2. The power analyzer system according to claim 1, wherein the representation of the RF signal and the representation of the power consumption are displayed over time.

3. The power analyzer system according to claim 2, wherein the representation of the RF signal and the representation of the power consumption are displayed over time on the same timescale.

4. The power analyzer system according to claim 1, wherein the standardized data protocol is at least one of a wireless local area network protocol, a Bluetooth protocol, a universal serial bus protocol and an Ethernet protocol and that the interface module is at least one of a wireless local area network interface module, a Bluetooth interface module, a universal serial bus interface module and an Ethernet interface module.

5. The power analyzer system according to claim 1, wherein the power probe unit is configured to measure at least one of the voltage supplied to the device under test, the current supplied to the device under test and the power supplied to the device under test.

6. The power analyzer system according to claim 1, wherein the representation of the power consumption represents at least one of the voltage supplied to the device under test, the current supplied to the device under test and the power supplied to the device under test.

7. The power analyzer system according to claim 1, wherein the representation of the RF signal represents the power of the RF signal of the device under test.

8. The power analyzer system according to claim 7, wherein the representation of the RF signal represents the total power or the power in a predetermined frequency band.

9. The power analyzer system according to claim 1, wherein the RF sensor unit is a RF power sensor unit.

10. The power analyzer system according to claim 1, wherein the RF sensor unit comprises at least one of a diode rectifier, a thermal power measurement module, a spectrum analyzer and a RF receiver.

11. The power analyzer system according to claim 1, wherein the power analyzer system comprises a housing in which at least one of the RF sensor unit, the power probe unit and the synchronization link are at least one of integrated and arranged.

12. The power analyzer system according to claim 1, wherein the analysis device is configured to execute a debugging software for debugging the device under test, wherein the analysis device is further configured to synchronize the debugging software with the displaying of the representation of the RF signal of the device under test and the representation of the power consumption of the device under test.

13. The power analyzer system according to claim 1, wherein the analysis device is configured to trigger the measurement of the RF sensor unit and the power probe unit based on the signal of at least one of the RF sensor unit and the power probe unit.

14. A power analyzer setup with a power analyzer system and a device under test,
   wherein the power analyzer setup comprises a RF sensor unit for sensing a RF signal of the device under test, a power probe unit for sensing a power consumption of the device under test and an analysis device being a physically separate device from the RF sensor unit and the power probe unit,
   wherein the analysis device comprises a display module and a standardized interface module for a standardized data protocol by which the analysis device is connected to the RF sensor unit and the power probe unit,
   wherein the analysis device is configured to control the RF sensor unit and the power probe unit, to receive measurement values from the RF sensor unit and the power probe unit as well as to synchronously display a representation of the RF signal of the device under test and a representation of the power consumption of the device under test,
   wherein the power probe unit is connected to the device under test such that the power probe unit is able to measure the power consumed by the device under test,
   wherein the RF sensor unit is arranged such that the RF sensor unit receives a RF signal generated by the device under test, and
   wherein the power analyzer system comprises a synchronization link between the RF sensor unit and the power probe unit for synchronization of the measurements, wherein the measurement values of the RF sensor unit and the measurement values of the power probe unit correspond to measurements taken at exactly the same time.

15. A power analyzer system for correlating power consumption and RF signals of a device under test, having a RF sensor circuit for sensing a RF signal of the device under test, a power probe circuit for sensing a power consumption of the device under test and an analysis device being a physically separate device from the RF sensor unit and the power probe unit,
- wherein the analysis device comprises a display circuit and a standardized interface circuit for a standardized data protocol by which the analysis device is connected to the RF sensor circuit and the power probe circuit,
- wherein the analysis device includes one or more circuits configured to control the RF sensor circuit and the power probe circuit, to receive measurement values from the RF sensor circuit and the power probe circuit as well as to synchronously display a representation of the RF signal of the device under test and a representation of the power consumption of the device under test, and
- wherein the power analyzer system comprises a synchronization link between the RF sensor unit and the power probe unit for synchronization of the measurements, wherein the measurement values of the RF sensor unit and the measurement values of the power probe unit correspond to measurements taken at exactly the same time.

16. The power analyzer system according to claim 15, wherein the analysis device includes one or more circuits configured to execute a debugging software for debugging the device under test, wherein said one or more circuits is further configured to synchronize the debugging software with the displaying of the representation of the RF signal of the device under test and the representation of the power consumption of the device under test.

17. The power analyzer system according to claim 15, wherein the analysis device includes one or more circuits configured to trigger the measurement of the RF sensor unit and the power probe unit based on the signal of at least one of the RF sensor unit and the power probe unit.

* * * * *